United States Patent
Levay et al.

(10) Patent No.: US 9,062,377 B2
(45) Date of Patent: Jun. 23, 2015

(54) REDUCING GLITCHING IN AN ION IMPLANTER

(71) Applicant: Varian Semiconductor Equipment Associates, Inc., Gloucester, MA (US)

(72) Inventors: William T. Levay, Rockport, MA (US); George M. Gammel, Marblehead, MA (US); Bon-Woong Koo, Andover, MA (US); Brant S. Binns, Beverly, MA (US); Richard M. White, Newmarket, NH (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 14/033,642

(22) Filed: Sep. 23, 2013

(65) Prior Publication Data
US 2014/0099430 A1 Apr. 10, 2014

Related U.S. Application Data

(60) Provisional application No. 61/710,017, filed on Oct. 5, 2012.

(51) Int. Cl.
*C23C 14/00* (2006.01)
*C23C 14/30* (2006.01)
(Continued)

(52) U.S. Cl.
CPC ............ *C23C 14/48* (2013.01); *C23C 14/5826* (2013.01); *C23C 14/021* (2013.01); *C23C 14/048* (2013.01); *C23C 14/022* (2013.01); (Continued)

(58) Field of Classification Search
CPC ............ H01J 37/32935; H01J 37/3171; C23C 14/021; C23C 14/022; C23C 14/048; C23C 14/5826; C23C 14/5873
USPC .............. 219/76; 134/1.1; 118/723 FE
See application file for complete search history.

(56) References Cited

U.S. PATENT DOCUMENTS 4,207,489 A * 6/1980 Camplan et al. ........... 313/363.1
4,743,767 A * 5/1988 Plumb et al. .............. 250/492.2
(Continued)

FOREIGN PATENT DOCUMENTS

WO 2005-059942 A2 6/2005

OTHER PUBLICATIONS

International Search Report and Written Opinion mailed Jan. 16, 2014 for PCT/US2013/062642 filed Sep. 30, 2013.
(Continued)

*Primary Examiner* — Gordon R Baldwin
*Assistant Examiner* — Mohammad Mayy (57) ABSTRACT

Methods of reducing glitch rates within an ion implanter are described. In one embodiment, a plasma-assisted conditioning is performed, wherein the bias voltage to the extraction electrodes is modified so as to inhibit the formation of an ion beam. The power supplied to the plasma generator in the ion source is increased, thereby creating a high density plasma, which is not extracted by the extraction electrodes. This plasma extends from the ion source chamber through the extraction aperture. Energetic ions then condition the extraction electrodes. In another embodiment, a plasma-assisted cleaning is performed. In this mode, the extraction electrodes are moved further from the ion source chamber, and a different source gas is used to create the plasma. In some embodiments, a combination of these modes is used to reduce glitches in the ion implanter.

18 Claims, 4 Drawing Sheets

(51) Int. Cl.
*H05H 1/00* (2006.01)
*C23C 14/48* (2006.01)
*C23C 14/58* (2006.01)
*C23C 14/02* (2006.01)
*C23C 14/04* (2006.01)
*H01J 37/24* (2006.01)
*H01J 37/248* (2006.01)
*H01J 37/317* (2006.01)
*H01J 37/32* (2006.01)

(52) U.S. Cl.
CPC ..... *H01L2224/81913* (2013.01); *H01J 37/241* (2013.01); *H01J 37/243* (2013.01); *H01J 37/248* (2013.01); *H01J 37/3171* (2013.01); *H01J 37/32412* (2013.01); *H01J 37/32935* (2013.01); *H01J 2237/0206* (2013.01); *H01J 2237/24535* (2013.01)

(56) References Cited

U.S. PATENT DOCUMENTS

| | | | |
|---|---|---|---|
| 7,531,819 B2 | 5/2009 | DiVergilio et al. | |
| 7,820,981 B2 | 10/2010 | Horsky et al. | |
| 7,947,129 B2* | 5/2011 | Murata et al. | 134/1.1 |
| 2010/0141221 A1* | 6/2010 | Ilic et al. | 323/234 |
| 2010/0154835 A1 | 6/2010 | Dimeo et al. | |
| 2011/0240876 A1 | 10/2011 | Sinclair et al. | |
| 2012/0285620 A1* | 11/2012 | Larson et al. | 156/345.28 |

OTHER PUBLICATIONS

Kurunczi, Peter, et al., Techniques for Improving the Performance and Extending the Lifetime of an Ion Source, U.S. Appl. No. 13/955,852, filed Jul. 31, 2013.

Gammel, George, et al., Reducing Glitching in an Ion Implanter, U.S. Appl. No. 61/723,604, filed Nov. 7, 2012.

* cited by examiner

REDUCING GLITCHING IN AN ION IMPLANTER

This application claims priority of U.S. Provisional Patent Application Ser. No. 61/710,017, filed Oct. 5, 2012, the disclosure of which is incorporated herein by reference in its entirety.

FIELD

This invention relates to ion implantation and, more particularly, to reducing glitching in an ion implanter.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Two concerns of the solar cell manufacturing industry are manufacturing throughput and cell efficiency. Cell efficiency measures the amount of energy converted into electricity. Higher cell efficiencies may be needed to stay competitive in the solar cell manufacturing industry. However, manufacturing throughput cannot be sacrificed at the expense of increased cell efficiency.

Ion implantation has been demonstrated as a viable method to dope solar cells. Use of ion implantation removes process steps needed for existing technology, such as diffusion furnaces. For example, a laser edge isolation step may be removed if ion implantation is used instead of furnace diffusion because ion implantation will only dope the desired surface. Besides removal of process steps, higher cell efficiencies have been demonstrated using ion implantation. Ion implantation also offers the ability to perform a blanket implant of an entire surface of a solar cell or a selective (or patterned) implant of only part of the solar cell. Selective implantation at high throughputs using ion implantation avoids the costly and time-consuming lithography or patterning steps used for furnace diffusion. Selective implantation also enables new solar cell designs. Any improvement to manufacturing throughput of an ion implanter or its reliability would be beneficial to solar cell manufacturers worldwide. This may accelerate the adoption of solar cells as an alternative energy source.

"Glitches" may occur during the ion implantation process. A glitch is defined as a sudden degradation in the beam quality during an ion implantation operation, typically due to a variation in an operating voltage. Such a glitch is typically caused by interactions between components along the beam path, which affect one or more operating voltages and can be caused at various locations along the beam path. For example, ion implanters generally employ several electrodes along this beam path, which accelerate the beam, decelerate the beam, or suppress spurious streams of electrons that are generated during operation. Each of these electrodes is maintained at a predetermined voltage. Often, electrodes of different voltage are located near each other and therefore arcing may occur between electrodes. Generally, arcing occurs across acceleration gaps, deceleration gaps, or suppression gaps, although arcing may occur elsewhere. Interaction between, for example, a source extraction voltage, source suppression voltage, and source beam current may cause a glitch. These glitches may be detected as a sharp change in the current from one of the power supplies. If the implantation is interrupted or affected by a glitch, the implanted solar cell or other workpiece may be negatively affected or even potentially rendered unusable. For example, a solar cell may have a lower efficiency due to the lower implanted dose caused by a glitch.

Use of a fluoride-containing gas during implantation may limit throughput due to this glitching. With a fluoride-containing gas, such as $BF_3$, this glitching may include arcing at the various electrodes in the implanter, such as between the ion source and the extraction electrodes. Any method that reduces glitching in an ion implanter will increase throughput and improve the quality of the implanted workpieces.

SUMMARY

Methods of reducing glitch rates within an ion implanter are described. In one embodiment, a plasma-assisted conditioning is performed, wherein the bias voltage to the extraction electrodes is modified so as to inhibit the formation of an ion beam. The power supplied to the plasma generator in the ion source is increased, thereby creating a high density plasma, which is not extracted by the extraction electrodes. This plasma extends from the ion source chamber through the extraction aperture. Energetic ions then condition the extraction electrodes. In another embodiment, a plasma-assisted cleaning is performed. In this mode, the extraction electrodes are moved further from the ion source chamber, and a different source gas is used to create the plasma. In some embodiments, a combination of these modes is used to reduce glitches in the ion implanter.

In one embodiment, a method of maintaining an ion implanter is disclosed. This method comprises operating the ion implanter in normal operating mode for a first time period; performing a first plasma-assisted conditioning, after the first time period, in order to reduce a glitch rate, wherein plasma-assisted conditioning is performed by modifying a voltage applied to extraction electrodes in the ion implanter; operating the ion implanter in normal operating mode for a second time period, after the first plasma-assisted conditioning; and performing a plasma-assisted cleaning after the second time period, wherein plasma-assisted cleaning is performed by modifying a distance between an ion source chamber and the extraction electrodes and modifying a source gas used in the ion source chamber.

In a second embodiment, a method of maintaining an ion implanter is disclosed. This method comprises operating the implanter in a normal operating mode; monitoring a glitch rate within the ion implanter, glitches being a result of material coating an extraction electrode disposed in the ion implanter; interrupting the normal operating mode to perform a plasma-assisted conditioning whenever the monitored glitch rate exceeds a predetermined threshold, in order to reduce the glitch rate, wherein the plasma-assisted conditioning is performed by modifying a voltage applied to extraction electrodes in the ion implanter; and performing a plasma-assisted cleaning when a thickness of material on the extraction electrode is determined to exceed a predetermined value, wherein the plasma-assisted cleaning is performed by modifying a distance between an ion source chamber and the extraction electrodes and modifying a source gas used in the ion source chamber.

In a third embodiment, a method of maintaining an ion implanter is disclosed. The method comprises operating the implanter in a normal operating mode, wherein a source gas is supplied to an ion source chamber, a plasma generator in the ion implanter is operated at a first power level, and extraction electrodes in the ion implanter are biased at a first set of bias voltages more negative than the voltage applied to walls of the ion source chamber so as to form an ion beam; monitoring a glitch rate within the ion implanter, glitches being a result of material coating the extraction electrodes disposed in the ion implanter; interrupting the normal operating mode to perform a plasma-assisted conditioning whenever the monitored glitch rate exceeds a predetermined threshold, in order to remove material from the extraction electrodes, wherein during the plasma-assisted conditioning, the plasma generator is operated at a second power level, greater than the first power level, and the extraction electrodes are biased at a second set of bias voltages, less negative voltage than the first set, such that an ion beam is not formed; and performing a plasma-assisted cleaning when a thickness of material on the extraction electrodes is determined to exceed a predetermined value, wherein during the plasma-assisted cleaning, the extraction electrodes are moved from their normal location to a position further from the ion source chamber and wherein the source gas is changed to a cleaning gas.

BRIEF DESCRIPTION OF THE DRAWINGS

For a better understanding of the present disclosure, reference is made to the accompanying drawings, which are incorporated herein by reference and in which.

DETAILED DESCRIPTION

These methods are described herein in connection with an ion implanter. However, these methods can be used with other systems and processes involved in semiconductor manufacturing or other systems that use a plasma or an ion beam. Thus, the invention is not limited to the specific embodiments described below.

As material builds up on extraction electrodes within an ion implanter, the glitch rate (or frequency of glitching) increases. Material buildup may "roughen" the surface of the electrode. This roughened surface may increase the local electrostatic field, which may lead to arcing.

Figure 3A:
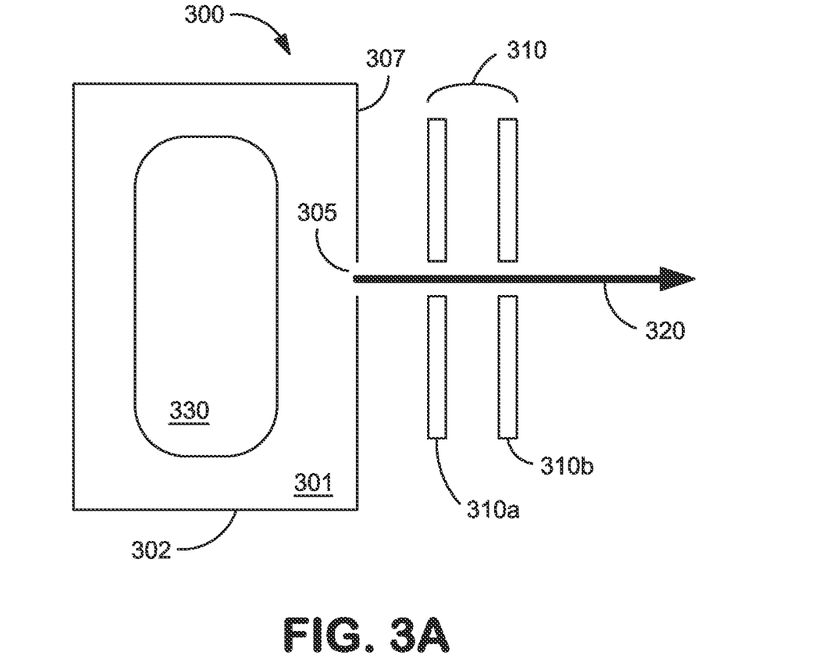
FIG. 3A illustrates some components used in a representative ion implanter.

FIG. 3A shows several components of a representative ion implanter, including an ion source 300, with one or more extraction electrodes 310 disposed proximate the extraction aperture 305 of the ion source 300. The ion source includes an ion source chamber 301 defined by a plurality of chamber walls 302. The ion source may include a dielectric window (not shown) through which energy, such as via a RF antenna, is injected into the ion source chamber 301. In another embodiment, an indirectly heated cathode (IHC) may be used to create the plasma 330 in the ion source chamber 301. Of course, other mechanisms may be used to generate the plasma 330 within the ion source chamber 301. Different mechanisms, which include an RF antenna, an IHC, a Bernas heater, and other devices known in the art, may be used as plasma generators. One or more of the chamber walls of the ion source chamber 301 may be made of a conductive material such that a bias voltage may be applied to these chamber walls 302. One of these conductive chamber walls, referred to as the faceplate 307, includes the extraction aperture 305, through which ions generated within the ion source chamber 301 may pass. These ions are directed toward a workpiece through the use of beam optics. The beam optics includes the faceplate 307 and the extraction electrodes 310. For example, the extraction electrodes 310 may include a suppression electrode 310a and a ground electrode 310b. During normal operation, chamber walls 302 of the ion source chamber 301 may be biased at a normal operating voltage, such as about +10 kV. Of course, other voltages may be used and the disclosure is not limited to this embodiment. The suppression electrode 310a may be biased at a much more negative potential, such as about −36 kV volts. The ground electrode 310b may be biased at a less negative bias voltage, such as −30 kV. This set of bias voltages may be referred to as normal operating voltages. During normal operation, a source gas, which typically contains one or more desired dopants, is fed through a nozzle (not shown) into the ion source chamber 301. The flow rate of this source gas may be about 5 sccm. The plasma generator, such as the RF antenna or the IHC, is used to energize the source gas and generate a plasma 330 in the ion source chamber 301. The negative voltages applied to the extraction electrodes 310 attract positive ions through the extraction aperture 305 to form an ion beam 320. Of course, other voltages and flow rates may be used and the disclosure is not limited to a particular embodiment.

There are two different methods that can be used to reduce the glitch rate. First, a plasma-assisted conditioning may be performed. This usually takes less than one minute, but can take longer in other embodiments.

Figure 3B:
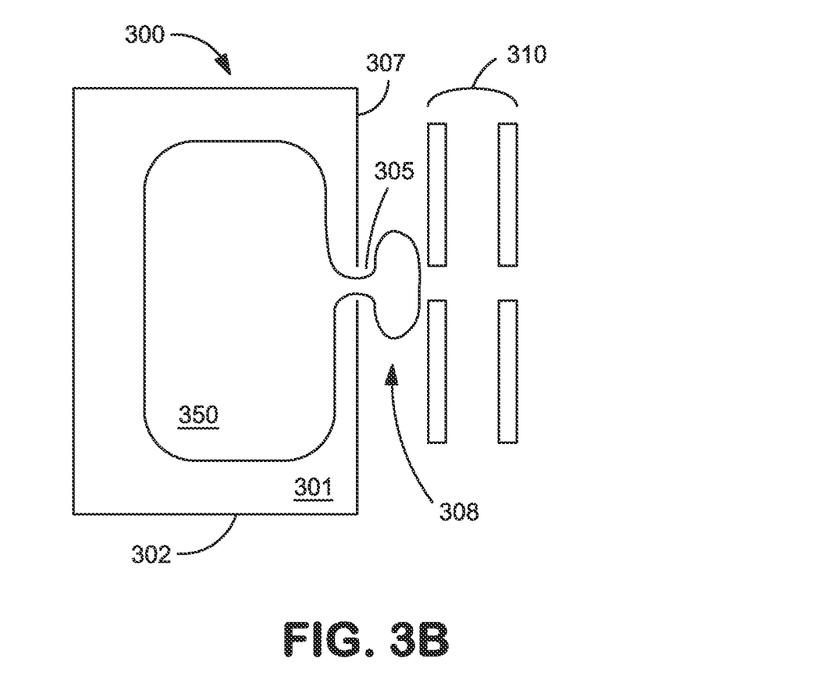
FIG. 3B illustrates the ion implanter of FIG. 3A during a plasma-assisted conditioning cycle.

During plasma-assisted conditioning, as shown in FIG. 3B, plasma 350 boundary oscillates and expands from within the ion source chamber 301 into the extraction region 308 between the extraction aperture 305 and suppression 310a and ground 310b electrodes. To begin the conditioning, the voltages applied to the extraction electrodes 310 may be modified. For example, in one embodiment, these bias voltages may be much less negative than those used during normal operation. For example, in one embodiment, the suppression electrode 310a may be biased at −6 kV while the ground electrode 310b is biased at 0 V. In another embodiment, the bias voltage applied to the suppression electrode 310a may also be 0V. These reduced bias voltages may be ineffective at generating an ion beam. In some embodiments, the plasma generator may be operated in a closed loop manner, such that its power level is modulated based on the measured ion beam current. Thus, in this embodiment, the modification of the bias voltages applied to the extraction electrodes 310 may cause additional power to be supplied to the plasma generator as it attempts to maintain the desired ion beam current. This increased power may create a high density plasma within the ion source chamber 301. In other embodiments, the plasma generator may be operated in an open loop configuration. In this embodiment, the power applied to the plasma generator may be modulated to create the effect described herein. During the plasma-assisted conditioning, the chamber walls 302 and the faceplate 307 of the ion source chamber 301 may be biased at their normal operating voltage, or may be biased at a different voltage, such as 0V.

This high density plasma with modified extraction voltages causes the plasma 350 to oscillate, as the plasma generator attempts to maintain the desired extraction current. This, in turn, causes both the plasma potential and plasma boundary to oscillate. The oscillating plasma forms the oscillating bias voltages in the extraction region 308 (i.e. the region between the faceplate 307 and the extraction electrodes 310). The combination of expanded plasma and bias voltages causes ion bombardment onto the surrounding extraction electrodes 310. This mechanism is referred to as plasma-assisted conditioning. After the desired duration has elapsed, the bias voltages of the extraction electrodes 310 and the chamber walls 302 of the ion source chamber 301 are returned to their normal operating voltages, and the ion beam 320 is formed again. This brief interruption may not change the process gas, source condition, or beam optics. Therefore, the original ion beam 320 may be restored in approximately two minutes or less in some instances. In some embodiments, the conditioning is completed in less than one minute. This conditioning may remove some material from the extraction electrodes 310. However, in some embodiments, the short duration and low voltages used during conditioning may not remove a significant amount of material. Rather, the surfaces of the extraction electrodes 310 may only be conditioned, whereby these surfaces may become smoother than before the conditioning began. In other words, small peaks on the surface of the extraction electrodes 310, from which arcs typically originate, may be smoothed by the plasma-assisted conditioning. The smoothness of these surfaces may reduce their propensity to arc, thereby reducing the glitch rate. It is possible that the plasma-assisted conditioning may not be able to remove all the material or impact the glitch rate as desired if the material has a certain thickness. In one instance, material with a thickness of approximately 100 microns may be too thick to be totally removed with plasma-assisted conditioning. Of course, changes to the parameters of the plasma-assisted conditioning that can remove thicker material deposits are possible.

In one particular embodiment of plasma-assisted conditioning, when an IHC is used as the plasma generator, the arc current of the IHC used in the ion source 300 is oscillated between 20 and 40 A while other bias voltages stayed constant, for example, at 0 V. This indicates that the source plasma density, plasma potential and plasma boundary changes over time, causing the source ions to be pulled out toward the extraction region 308 at varying angles. The mechanical oscillation of the ions striking the surfaces of the extraction electrodes 310 with the elevated temperature of the source/extraction may remove some of the materials deposited on the surfaces of the extraction electrodes 310. This resets the glitch performance, especially during the initial phase of ion beam operation. This may be used specifically with a boron ion beam, such as an ion beam generated from $BF_3$. This may be due to the chemical ability of fluorine ions to remove previously deposited material from the extraction electrodes 310.

Second, a plasma-assisted cleaning may be performed. This is usually a cleaning process using an argon plasma to sputter the various surfaces, though other noble gases, other inert species, or other species may be used. It typically takes between 15 and 60 minutes, but longer or shorter cleaning processes are possible. The additional time compared to the plasma-assisted conditioning may be needed to change source gases and beam optics settings. For example, to reset to the desired implant species, an additional 15 to 60 minutes may be needed. In some embodiments, the plasma-assisted cleaning requires a change in source gas. As described above, a suitable gas for plasma-assisted cleaning may comprise a noble gas, such as argon. The flow rate of this cleaning gas may be the same as that used in normal operating mode, such as 5 sccm. This is used to create a cleaning plasma 370, as shown in FIG. 3C.

Figure 3C:
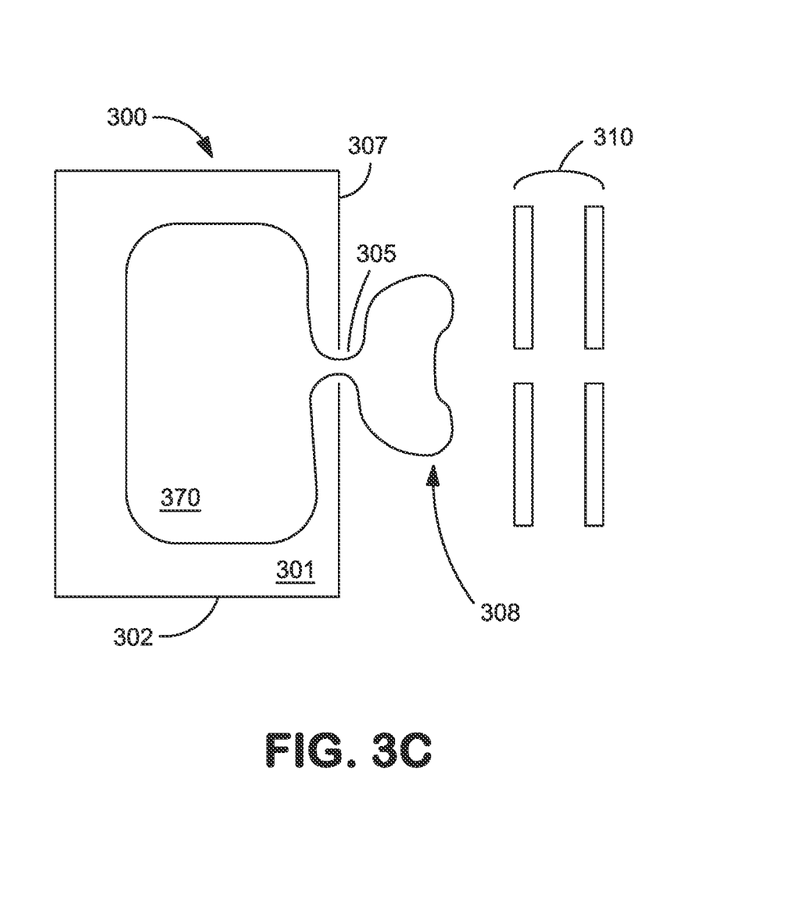
FIG. 3C illustrates the ion implanter of FIG. 3A during a plasma-assisted cleaning cycle.

In addition, the extraction electrodes 310 may be physically moved relative to the ion source chamber 301, as shown in FIG. 3C. In this embodiment, the extraction electrodes 310 are moved further away from the ion source chamber 301, and specifically from the faceplate 307. For example, during normal operating mode, the suppression electrode 310a may be about 10 mm from the faceplate 307. During plasma-assisted cleaning, this separation distance may be increased to, for example, 22 mm. In addition, as described above with respect to the plasma-assisted conditioning, the bias voltages applied to chamber walls 302 and the faceplate 307 of the ion source chamber 301 and the extraction electrodes 310 may be modified. For example, in one embodiment, the ground electrode 310b, chamber walls 302 and the faceplate 307 may all be biased at 0V. The suppression electrode 310a may be negatively biased relative to these components, such as at −3 kV. Additionally, the power supplied to the plasma generator may be modified. Since the extraction electrodes 310 have been moved away from the faceplate 307, they are unable to attract positive ions as is done in normal operation. As a consequence, when closed loop control is used, the power supplied to the plasma generator is increased, as it attempts to maintain the desired ion beam current. In an open loop configuration, additional power may be supplied to the plasma generator to create the desired high density plasma. While longer in duration than the plasma-assisted conditioning, plasma-assisted cleaning can remove deposits from the extraction electrodes 310 that plasma-assisted conditioning may be unable to remove or may be unable to remove in a reasonable time. Since plasma-assisted cleaning may use a sputtering mechanism, the effects may be proportional to energy, density, and time. In one particular embodiment, the sputtered material coats the front surface of the suppression electrode 310a (i.e. the surface that faces the extraction aperture 305), which covers particles that have deposited on that surface and that could otherwise contribute to an increased glitch rate.

In other words, two different methods of resetting the glitch performance in the extraction region 308 are disclosed. The first method, referred to as plasma-assisted conditioning, conditions the extraction electrodes 310 through the manipulation of source plasma 330, by modifying the power supplied to the plasma generator, and by modifying the bias voltages applied to the ion source chamber 301 and the extraction electrodes 310. During this method, the source gas is not modified, allowing quick transition back to operating mode. The second method, referred to as plasma-assisted cleaning, changes the voltages applied to the various components, as was done in the conditioning mode. However, additionally, the source gas from which the plasma is created is changed to increase the ability to remove material from the extraction electrodes. In addition, the physical location of the extraction electrodes 310 is modified to allow a more complete cleaning.

In one experiment using a $B^+$ ion beam, performing a one minute plasma-assisted conditioning reduced the glitch rate from 67 per hour to 30 per hour. Performing a one hour argon plasma-assisted cleaning reduced the glitch rate for a $B^+$ ion beam from 80 per hour to 38 per hour. In another test, the glitch rate was reduced was about 34 per hour to about 8 per hour. The benefits using each method may be compared to the relative duration to perform each or the relative throughput impact for each.

Figure 1:
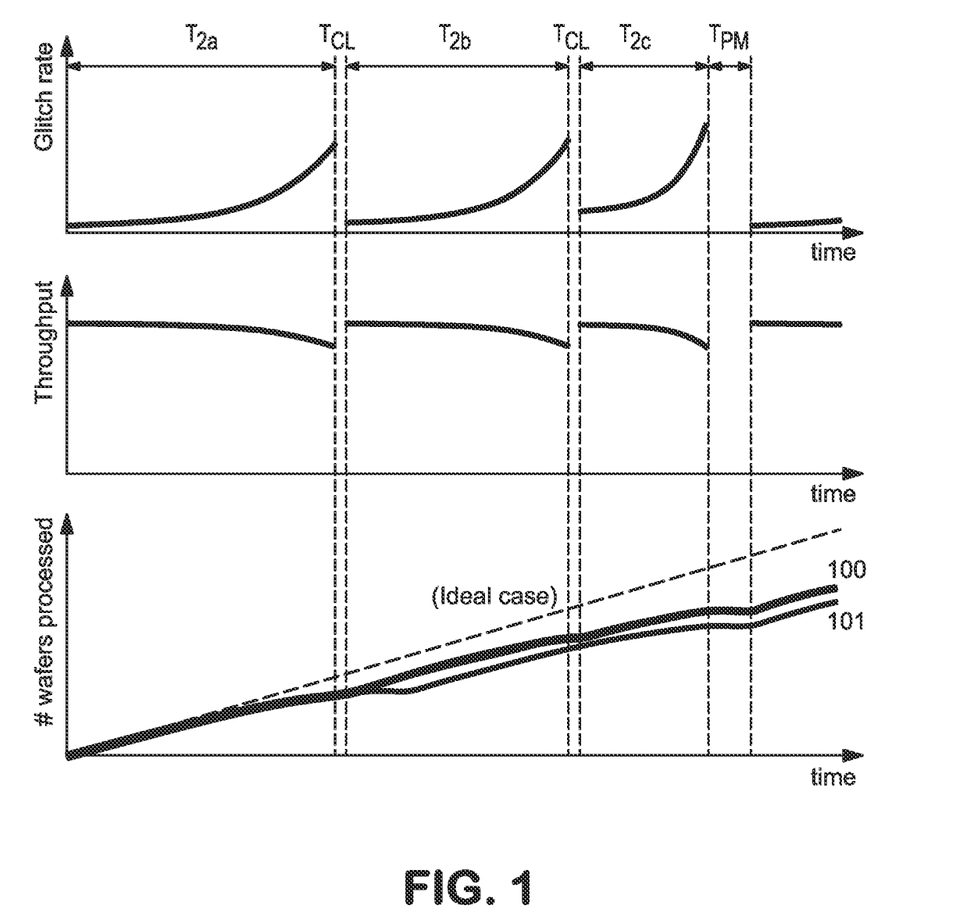
FIG. 1 are charts representing glitch rate, throughput, and number of wafers processed over time in a first embodiment.

FIG. 1 are charts representing glitch rate, throughput, and number of wafers processed over time in a first embodiment. In this embodiment, a plasma-assisted cleaning is performed at times $T_{CL}$. $T_{PM}$ represents preventative maintenance of the ion source 300 and extraction electrodes 310, which may take between three and four hours in one instance.

In one embodiment, preventative maintenance involves venting the ion source chamber, cleaning or replacing parts in the ion source 300, pumping the ion source chamber back to vacuum, and then calibrating the ion beam 320. Line 100 represents the number of wafers processed using the method illustrated in FIG. 1. $T_{2a}$ through $T_{2c}$ represent continuous beam operation periods between cleanings (i.e. the mode of operation shown in FIG. 3A). In some embodiments, the durations of $T_{2a}$ through $T_{2c}$ are predetermined. For example, the durations of the continuous beam operation periods may be based on operating parameters, such as the type of source gas used and the desired ion beam current. In a further embodiment, the duration of each continuous beam operation period is shorter than the preceding one. This may be due to the fact that the cleanings may not remove all of the material from the extraction electrodes 310, so material buildup occurs more quickly each time. In other embodiments, the initiation of cleanings may be determined based on a glitch detector. In this way, a cleaning is performed whenever the glitch rate exceeds a predetermined rate. Thus, there is no predetermined time period associated with the continuous beam operation periods, $T_{2a}$ through $T_{2c}$.

As a comparison, line 101 represents the number of wafers processed if only preventative maintenance is performed without the plasma-assisted cleaning. Note that without the periodic cleanings, the overall throughput decreases, as the glitch rate continues to increase. For example, even through no workpieces are processed during the cleanings, the overall throughput using the plasma-assisted cleaning (line 100) is still greater than the throughput using only preventative maintenance (line 101). In addition, the overall down time with two $T_{CL}$ may be shorter than with one $T_{PM}$.

As another example, consider a boron beam current operated at 60 mA. In this case, the source should be replaced in every 60 hours, which takes ~3 hours to go back to full operation. With the plasma-assisted cleaning, the source can last 120 hours with less than 1 hour of total interruption. As a result, the tool uptime could be improved from 95% to 97%.

In some embodiments, the preventative maintenance is performed at fixed time intervals, such as every 96 hours. In other embodiments, the preventative maintenance may be performed after every N cleanings, where N is a configurable value. In the example shown in FIG. 1, N is assigned a value of 2. In yet another embodiment, the preventative maintenance may be performed if the duration of the previous continuous beam operation period (i.e. $T_{2c}$) is less than a predetermined threshold. This embodiment may be used when continuous beam operation is determined based on glitch rate. In other words, if the duration between the end of the previous cleaning and the time when the glitch rate exceeds its predetermined threshold is too short, it may be assumed that the cleanings are no longer effective. In this case, a preventative maintenance may be performed. In another embodiment, preventative maintenance may be initiated based on the operating conditions of the ion implanter. For example, in one embodiment, once the glitch rate exceeds a predetermined threshold or the throughput drops below a predetermined threshold, preventative maintenance may be scheduled.

Furthermore, it is also noted that, although not shown, the throughput achieved by more frequent preventative maintenance may be less than that shown in line 100. For example, performing a preventative maintenance instead of a plasma-assisted cleaning, may reduce the overall throughput due to the long duration of $T_{PM}$, as compared to $T_{CL}$. In other words, although a preventative maintenance may be more effective at removing material from the extraction electrodes 310 than a plasma-assisting cleaning, its long duration may ultimately reduce throughput.

Figure 2:
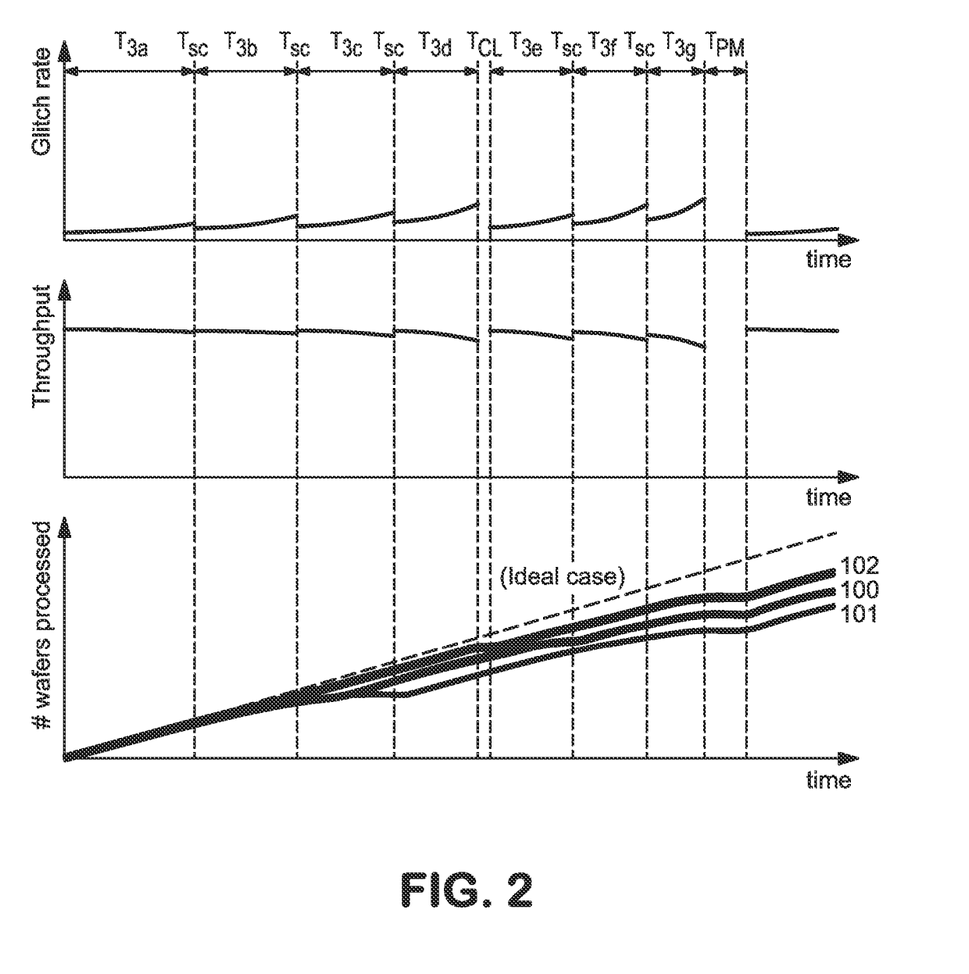
FIG. 2 are charts representing glitch rate, throughput, and number of wafers processed over time in a second embodiment.

FIG. 2 are charts representing glitch rate, throughput, and number of wafers processed over time in a second embodiment. This embodiment uses a combination of plasma-assisted conditioning and plasma-assisted cleaning. The plasma-assisted cleaning is represented by $T_{CL}$ and the plasma-assisted conditioning is represented by $T_{SC}$. $T_{3a}$ through $T_{3g}$ represent continuous beam operation periods between conditionings or cleanings (i.e. the mode of operation shown in FIG. 3A). Plasma-assisted conditioning can remove some material buildups on the extraction electrodes 310 and can be combined with a plasma-assisted cleaning. A combination of these two methods can be combined to increase throughput and the number of wafers processed. Line 102 represents the number of wafers processed using this method combining the plasma-assisted cleaning and plasma-assisted conditionings illustrated in FIG. 2. Line 102 may be compared to line 101 or line 100 from FIG. 1. As seen in FIG. 2, the combination method shown with line 102 provides the highest number of processed wafers. Use of plasma-assisted conditioning may only take one to two minutes, which has a significantly smaller impact on throughput than a plasma-assisted cleaning.

In some embodiments, the plasma-assisted conditioning occurs at predetermined time intervals. In some further embodiments, these time intervals may decrease for each subsequent continuous beam operation period. This may be due to the fact that the conditionings may not remove all of the material from the extraction electrodes 310, so material buildup occurs more quickly each time. In other embodiments, the plasma-assisted conditioning is initiated by detection of a glitch rate that exceeds a predetermined threshold.

In some embodiments, a plasma-assisted cleaning occurs after a predetermined number of plasma-assisted conditionings have been performed. In another words, a plasma-assisted cleaning may occur after N plasma-assisted conditionings, where N is a configurable value. In another embodiment, the plasma-assisting conditionings are initiated based on glitch rate. In this embodiment, a plasma-assisted cleaning may be initiated when the time between two successive plasma-assisted conditionings is less than a predetermined time. This may imply that the conditionings have become ineffective at removing sufficient material from the extraction electrodes 310 to lower the glitch rate. Furthermore, in this embodiment, the preventative maintenance may be initiated when the time between two plasma-assisted cleanings is less than a predetermined time. Alternatively, the preventative maintenance may be initiated based on the time between two plasma-assisted conditionings.

In other embodiments, preventative maintenance may be performed after a specific number of cleanings or a specific number of conditionings and cleanings. In yet another embodiment, preventative maintenance may be performed after a specified time duration, such as 96 hours and is not affected by the number or frequency of the cleanings and conditionings.

In the specific embodiment of FIG. 2, three plasma-assisted conditioning steps are performed prior to a plasma-assisted cleaning. This cycle of three plasma-assisted conditionings and a plasma-assisted cleaning is repeated twice. However, the second time the plasma-assisted cleaning is replaced with preventative maintenance. Of course, other variations or combinations of these steps are possible and FIG. 2 is merely illustrated as an example. For example, additional plasma-assisted conditionings may be performed with a similar number of plasma-assisted cleanings or preventative maintenance steps.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of maintaining an ion implanter, comprising:
   operating said ion implanter in normal operating mode for a first time period, wherein a plasma generator is energized at a first power level so as to generate a plasma within an ion source chamber;
   performing a first plasma-assisted conditioning, after said first time period, in order to reduce a glitch rate, wherein plasma-assisted conditioning is performed by modifying a voltage applied to extraction electrodes in said ion implanter and by operating the plasma generator at a power level greater than said first power level, such that said plasma expands from within said ion source chamber to an extraction region between said ion source chamber and said extraction electrodes;
   operating said ion implanter in normal operating mode for a second time period, after said first plasma-assisted conditioning; and
   performing a plasma-assisted cleaning after said second time period, wherein plasma-assisted cleaning is performed by modifying a distance between said ion source chamber and said extraction electrodes and modifying a source gas used in said ion source chamber.

2. The method of claim 1, wherein said glitch rate of said ion implanter is monitored, and said first plasma-assisted conditioning is initiated when said monitored glitch rate exceeds a first threshold.

3. The method of claim 1, further comprising:
   performing a second plasma-assisted conditioning after said second time period;
   operating said ion implanter in normal operating mode after said second plasma-assisted conditioning for a third time period; and
   wherein said plasma-assisted cleaning is performed after said third time period.

4. The method of claim 3, said glitch rate of said ion implanter is monitored, and said first plasma-assisted conditioning and said second plasma-assisted conditioning are initiated when said monitored glitch rate exceeds a first threshold.

5. The method of claim 3, wherein said first time period comprises a first predetermined time duration and said second time period comprises a second predetermined time duration, wherein said second predetermined time duration is less than said first predetermined time duration.

6. The method of claim 1, wherein said performing a plasma-assisted conditioning and said operating in normal operating mode are each performed a predetermined number of times; and
   wherein said plasma-assisted cleaning is initiated after said predetermined number of times.

7. The method of claim 1, wherein modifying said voltage applied to said extraction electrodes comprises biasing said extraction electrodes at a voltage less negative than a voltage used during said normal operating mode.

8. The method of claim 1, wherein modifying said distance comprises increasing said distance between said ion source chamber and said extraction electrodes.

9. A method of maintaining an ion implanter, comprising:
   operating said implanter in a normal operating mode, wherein a plasma generator is energized at a first power level so as to generate a plasma within an ion source chamber;
   monitoring a glitch rate within said ion implanter, glitches being a result of material coating an extraction electrode disposed in said ion implanter;
   interrupting said normal operating mode to perform a plasma-assisted conditioning whenever said monitored glitch rate exceeds a predetermined threshold, in order to reduce said glitch rate, wherein said plasma-assisted conditioning is performed by modifying a voltage applied to extraction electrodes in said ion implanter and by operating the plasma generator at a power level greater than said first power level, such that said plasma expands from within said ion source chamber to an extraction region between said ion source chamber and said extraction electrodes; and
   performing a plasma-assisted cleaning when a determination is made that a thickness of material on said extraction electrode exceeds a predetermined value, wherein said plasma-assisted cleaning is performed by modifying a distance between an ion source chamber and said extraction electrodes and modifying a source gas used in said ion source chamber.

10. The method of claim 9, wherein said determination is made based on a number of plasma-assisted conditionings that are performed.

11. The method of claim 9, wherein at least two plasma-assisted conditionings are performed, and wherein said determination is made when a duration of time between successive plasma-assisted conditionings is less than a predetermined value.

12. The method of claim 9, wherein modifying said voltage applied to said extraction electrodes comprises biasing said extraction electrodes at a voltage less negative than a voltage used during said normal operating mode.

13. The method of claim 9, wherein modifying said distance comprises increasing said distance between said ion source chamber and said extraction electrodes.

14. A method of maintaining an ion implanter, comprising:
   operating said implanter in a normal operating mode, wherein a source gas is supplied to an ion source chamber, a plasma generator in said ion implanter is operated at a first power level to generate a plasma within said ion source chamber, and extraction electrodes in said ion implanter are biased at a first set of bias voltages more negative than the voltage applied to walls of said ion source chamber so as to form an ion beam;
   monitoring a glitch rate within said ion implanter, glitches being a result of material coating said extraction electrodes disposed in said ion implanter;

interrupting said normal operating mode to perform a plasma-assisted conditioning whenever said monitored glitch rate exceeds a predetermined threshold, in order to remove material from said extraction electrodes, wherein during said plasma-assisted conditioning, said plasma generator is operated at a second power level, greater than said first power level, and said extraction electrodes are biased at a second set of bias voltages, less negative voltage than said first set, such that an ion beam is not formed and said plasma expands from within said ion source chamber to an extraction region between said ion source chamber and said extraction electrodes; and performing a plasma-assisted cleaning when a determination is made that a thickness of material on said extraction electrodes exceeds a predetermined value, wherein during said plasma-assisted cleaning, said extraction electrodes are moved from their normal location to a position further from said ion source chamber and wherein said source gas is changed to a cleaning gas.

15. The method of claim 14, wherein said determination is made based on a number of plasma-assisted conditionings that are performed.

16. The method of claim 14, wherein at least two plasma-assisted conditionings are performed, and wherein said determination is made when a duration of time between successive plasma-assisted conditionings is less than a predetermined value.

17. The method of claim 14, wherein during said plasma-assisted cleaning, said extraction electrodes are biased to a third set of voltages, less negative than said first set, so that an ion beam is not formed.

18. The method of claim 14, wherein said plasma-assisted conditioning is performed for less than two minutes.

* * * * *